(12) United States Patent
Wong et al.

(10) Patent No.: US 9,704,874 B2
(45) Date of Patent: Jul. 11, 2017

(54) ROM SEGMENTED BITLINE CIRCUIT

(71) Applicant: eASIC Corporation, Santa Clara, CA (US)

(72) Inventors: Ban P. Wong, Milpitas, CA (US); Hui Hui Ngu, Penang Island (MY)

(73) Assignee: eASIC Corporation, Santa Clara, CA (US)

( * ) Notice: Subject to any disclaimer, the term of this patent is extended or adjusted under 35 U.S.C. 154(b) by 0 days.

(21) Appl. No.: 14/963,437

(22) Filed: Dec. 9, 2015

(65) Prior Publication Data

US 2017/0170186 A1 Jun. 15, 2017

(51) Int. Cl.
*G11C 5/06* (2006.01)
*H01L 27/112* (2006.01)
*G11C 7/12* (2006.01)
*H01L 21/768* (2006.01)
*H01L 23/528* (2006.01)
*H01L 23/522* (2006.01)

(52) U.S. Cl.
CPC .......... *H01L 27/11213* (2013.01); *G11C 5/06* (2013.01); *G11C 7/12* (2013.01); *H01L 21/768* (2013.01); *H01L 23/528* (2013.01); *H01L 23/5226* (2013.01)

(58) Field of Classification Search
CPC .......... H01L 27/11213; H01L 23/5226; H01L 23/528; H01L 21/768; G11C 5/06; G11C 7/12
See application file for complete search history.

(56) References Cited

U.S. PATENT DOCUMENTS

| | | | |
|---|---|---|---|
| 5,745,422 A * | 4/1998 | Iadanza | G11C 7/18 365/203 |
| 6,084,841 A | 7/2000 | Sugiura et al. | |
| 7,157,937 B2 | 1/2007 | Apostol et al. | |
| 2006/0291300 A1* | 12/2006 | Di Gregorio | G11C 7/12 365/189.08 |
| 2010/0110795 A1* | 5/2010 | Tamada | G11C 16/10 365/185.19 |
| 2012/0195104 A1* | 8/2012 | Takemura | G11C 11/4097 365/149 |

* cited by examiner

*Primary Examiner* — Richard Elms
*Assistant Examiner* — Mohammed A Bashar
(74) *Attorney, Agent, or Firm* — Panitch Schwarze Belisario & Nadel LLP

(57) ABSTRACT

A bitline structure for use in a memory device may be connected to a plurality of bit memory cells. The bitline may be segmented into segments connected to one-third of the plurality of bit memory cells and two-thirds of the bit memory cells, respectively. The segments may be electrically coupled to each other to provide an overall bitline output.

18 Claims, 7 Drawing Sheets

| Delay of each stage (ps) | 1/3 segmentation | | | 1/2 segmentation | | |
|---|---|---|---|---|---|---|
| | WL[0] | WL[192] | WL[256] | WL[0] | WL[192] | WL[256] |
| Wordline (rise) -> BITLINE A (fall) | 330 | - | - | 415 | 390 | - |
| BITLINE A (fall) -> NET A (rise) | 157 | - | - | 184 | 176 | - |
| NET A (rise) -> BITLINE B (fall) | 158 | - | - | 143 | 142 | - |
| Wordline (rise) -> BITLINE B (fall) | - | 471 | 459 | - | - | 391 |
| BITLINE B (fall) -> OUT (rise) | 43.9 | 47.2 | 47.4 | 40 | 39.5 | 45.3 |
| Total delay, Wordline (rise) -> OUT (rise) | 688.9 | 518.2 | 506.4 | 782 | 747.5 | 436.3 |

FIG. 7

ROM SEGMENTED BITLINE CIRCUIT

BACKGROUND OF THE INVENTION

In deep submicron technology, System-on-Chip (SoC) products may require a high-speed and low-power embedded memory to support increasing storage capability. Both random access memory (RAM) and read only memory (ROM) have been widely used. ROM may be dedicated to read operation with non-volatile stored data which is essential for boot-up processing.

The search for higher capacity and higher speed memory has intensified over the years. However, there is an evident tradeoff between the capacity and the speed. The higher the capacity, the slower the access speed.

DESCRIPTION OF THE RELATED ART

An approach to improve the performance and power consumption of a dynamic logic circuit with a bitline repeater circuit has been described in U.S. Pat. No. 6,084,810. In the prior art, an inverter R1 of FIG. 1 is inserted at a mid-point of the said bitline to speed up bitline access while reducing power. The prior art also claims that transistor T1 of bitline circuit FIG. 1 increases performance slightly by lowering the discharge constant slightly.

SUMMARY OF EMBODIMENTS OF THE INVENTION

Embodiments of the present invention may relate to a design technique to improve the power and the access speed of a higher capacity ROM. The proposed technique may be applicable for other type of memories.

An embodiment of the invention may comprise a circuit that includes wordlines and bitlines, which may be found, e.g., in a conventional memory design; a programmable memory array; bitline segmentation at ⅓ of the said bitline; a precharge circuit inserted right before the bitline segmentation; and a bitline keeper connected in series with a shutdown transistor.

The listed features may provide improved performance and decreased power consumption compared to prior art and conventional memory circuits. Other features and advantages of the present invention will become apparent upon consideration of the following detailed description and the accompanying drawings.

BRIEF DESCRIPTION OF THE DRAWINGS

Various embodiments of the invention will now be described in conjunction with the accompanying drawings, in which:

FIG. 7 shows simulation data related to various embodiments of the invention.

DETAILED DESCRIPTION OF EXAMPLE EMBODIMENTS OF THE INVENTION

Figure 2:
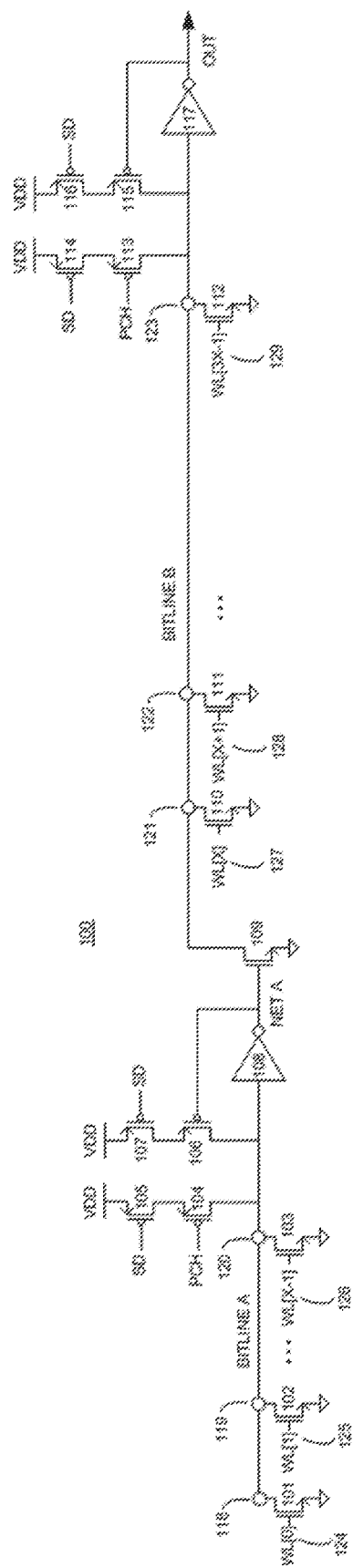
FIG. 2 is an illustration of a bitline circuit including segmented bitlines, bitline keepers and shutdown transistors in accordance with various example embodiments of the present invention.

FIG. 2 illustrates a bitline circuitry related to various examples of embodiments of the present invention. This circuit may include a programmable ROM array whose bit cells may correspond to transistors, 101, 102, 103, 110, 111, 112 (and possibly further or fewer cells/transistors), precharge transistors 104 and 113, bitline keeper transistors 106 and 115, shutdown transistors 105, 107, 114 and 116, wordlines 124, 125, 126, 127, 128 and 129 (and possibly further or fewer wordlines), inverter 108, output driver 117 and a bitline, shown segmented into bitlines A and B.

In a programmable ROM array, the content of the ROM block may be customized by a custom via layer, e.g., similar to what may be described in U.S. Pat. No. 7,157,937. Via sites 118, 119, 120, 121, 122 and 123 signify possible connections between the N-channel field effect transistors (NFETs) and the bitline. The presence of a via at a respective via site signifies that the respective NFET is connected between bitline and ground. When the wordline of the programmed (i.e., connected) NFET is activated, the bitline will be discharged to ground through the NFET. When that happens, the ROM may read out data 1, after the inversion at output driver 117.

The absence of a via at a respective via site signifies that the respective NFET is not connected to the bitline. When the wordline of such an unprogrammed NFET is activated, the bitline will not be discharged to ground through that NFET, as there is no path to ground present. The bitline will, consequently, stay at the precharge state (assuming that no other NFET is programmed and activated). When that happens, the ROM may read out data 0, after the inversion at the output driver 117.

Figure 3:
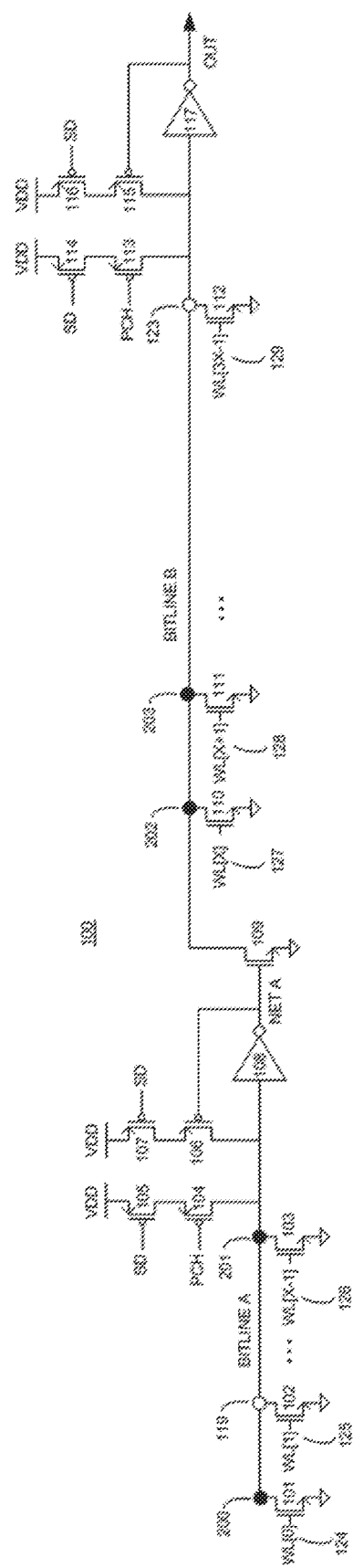
FIG. 3 is an illustration of a randomly programmed ROM.

FIG. 3 shows a randomly programmed ROM array. Darkened sites in the figure symbolize the presence of the selected vias 200, 201, 202 and 203. In this example, when wordline 124 is activated, the readout data is 1. In contrast, when wordline 125 is activated, the readout data is 0.

A read operation may commence when the wordline is activated. After the wordline is activated, the bitline may take a period of time to fully discharge to ground. The period of time taken may depend on the bitline capacitance. By partitioning the bitline into smaller portions, it may reduce the bitline capacitance proportionally. When wordline 124 is activated, BITLINE A may start to discharge to ground. Since BITLINE A is ⅓ of the total bitline, the time taken by BITLINE A to be discharged to ground will be reduced, and the reduction may be proportionally to the reduction in bitline length (i.e., by approximately ⅔, when BITLINE A is ⅓ of the total bitline). Additionally, an RC time constant of BITLINE A will be reduced, and this reduction may correspond to the square of the line length reduction. When BITLINE A goes to 0, the NET A goes to 1. A PFET to NFET ratio of inverter 108 can be skewed in such a way that the PFET has much larger drive strength and hence can switch to 1 faster.

NFET 109 is a transistor that may be used to pull BITLINE B down to ground. In accordance with features of this invention, the gate width of NFET 109 may be sized up to approximately 3× (or more) that of other pulldown NFETs, e.g., 101, 102, 103, 110, 111 and 112, without causing significant increase to the overall layout area and power. Increase the gate width of NFET 109 may increase its drive strength and significantly reduce the time taken to discharge BITLINE B.

Figure 1:
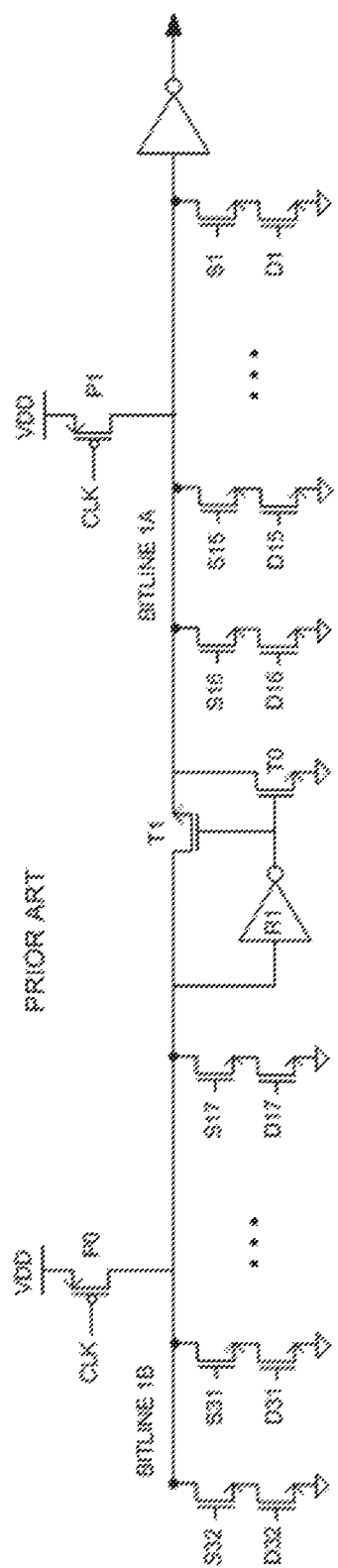
FIG. 1 is an illustration of a bitline circuit of prior art.

In accordance with features of various embodiments of this invention, bitline segmentation does not need an additional NFET connecting the first bitline partition to the second bitline partition, as found in T1 of FIG. 1 in the prior art. The extra NFET is a liability because it creates extra RC (delay) to BITLINE A, thus slowing down the discharge of BITLINE A. In contrast, the example of FIG. 2 may permit one to increase the drive strength of NFET 109, which may thus speed up the discharge of BITLINE B.

In the example of FIG. 2, during precharge cycle, precharge transistors 104 and 113 are activated. BITLINE A and BITLINE B will be charged up to a voltage corresponding to a logical 1. When BITLINE A goes to 1, the NET A may go to 0 (or a voltage corresponding to a logical 0), turning off NFET 109. NFET 109 may advantageously be turned off fast enough to avoid crowbar current. In accordance with features of various embodiments of this invention, of the two precharge transistors 104 and 113, precharge transistor 104 may advantageously be placed closer to the inverter 108, and precharge 113 may advantageously be placed further from inverter 108. In other words, the first precharge transistor 104 of the first bitline partition would thus be placed close to the end of the first bitline segmentation, and the second precharge transistor 113 would thus be placed close to the end of the second bitline segmentation. Positioning precharge transistor 104 close to inverter 108 may thus enable NFET 109 to be turned off before the drain of the NFET 109 is charged up to 1 by the precharge transistor 113, which is positioned at the far end of the bitline in FIGS. 2 and 3. This arrangement may eliminate the need for footer devices or separate select (S1 through S32) and data (D1 through D32) devices, as in the prior art. With a single bitline pulldown device (101 through 112), the bitline discharge may be faster with a corresponding device size. This arrangement can also enable a low power version by reducing the size of the bitline pulldown devices (101 through 112) for the same speed as the prior art while reducing chip area for cost reduction.

In accordance with features that may be found in various embodiments of this invention, during the long cycles of idling, shutdown transistors 105, 107, 114 and 116 can be turned off to save power. By cutting off the power supply to the megabit or gigabit ROM transistors, it may potentially reduce the static current by, e.g., 80%.

The bitline keepers 106 and 115 may be used to maintain the bitline at level 1 when the ROM is not being accessed. The strength of bitline keeper may not be too strong to limit the contention that may impact the discharge rate of the bitline during a read operation. One way to weaken the transistor strength is to increase the gate length. However, increasing the gate length of bitline keepers 106 and 115 may increase the loading of inverter 108 and may reduce the overall speed. In accordance with features of various embodiments of this invention, the gate length of the shutdown transistors 107 and 116, which are placed in series with bitline keepers 106 and 115, may be increased to gate lengths that will maintain the bitline at a high level while reading a "0" and, at the same time, may serve to minimize the contention between the pulldown bit while reading a "1". Increasing the gate length of shutdown transistors 107 and 116 may increase the effective gate length in series with the bitline keepers 106 and 115 without impacting the overall speed, since the extra capacitance of the gates of transistors 107 and 116 is not seen by inverters 108 and 117, respectively, which are in the critical path of the read operation in the examples of FIGS. 2 and 3.

Figure 4:
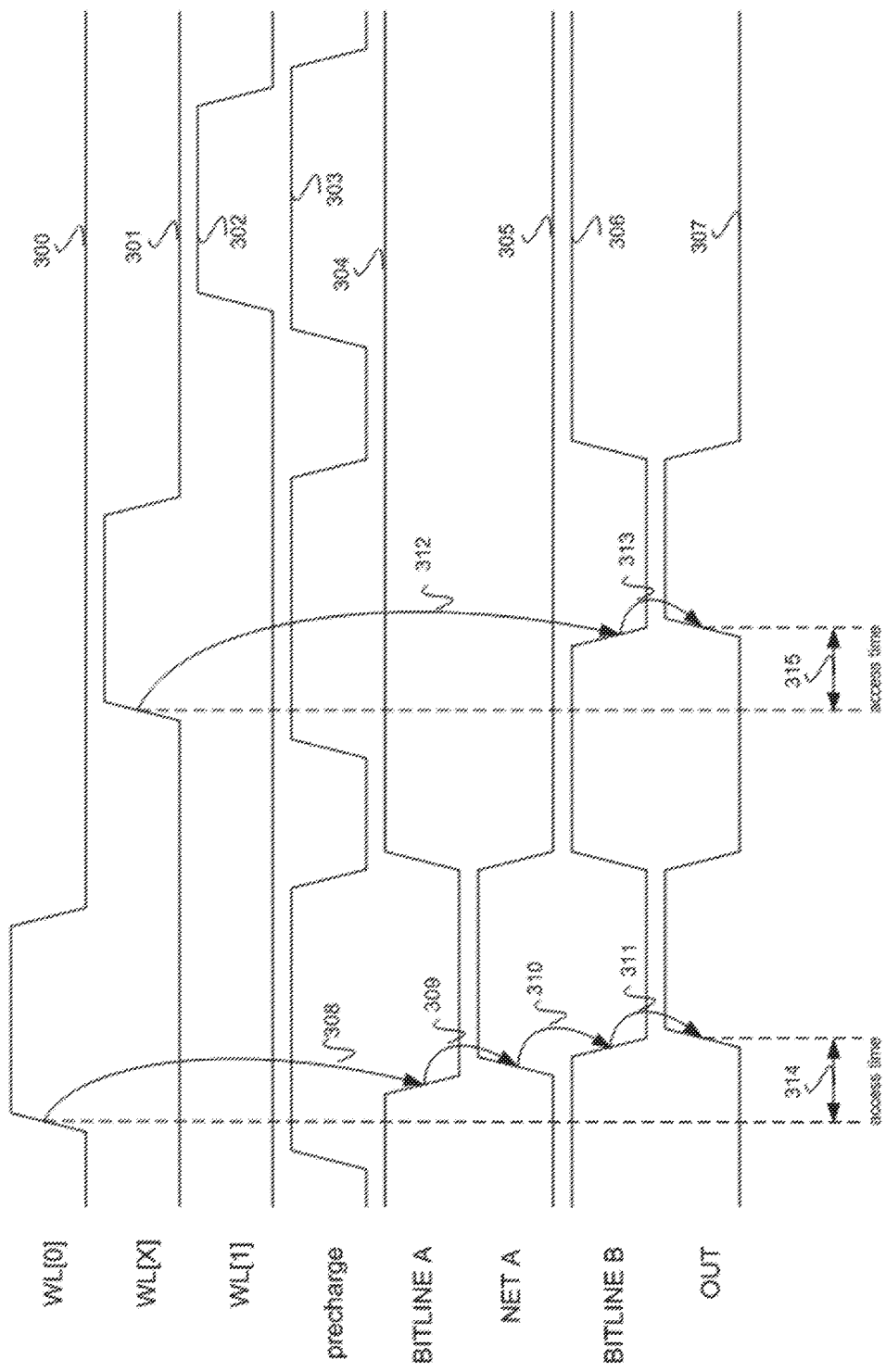
FIG. 4 illustrates waveforms demonstrating the relationships between various signals corresponding to FIG. 3.

FIG. 4 illustrates examples of waveforms demonstrating the relationships among various signals corresponding to FIG. 3. FIG. 4 includes waveforms for WL[0] 300, WL[X] 301, WL[1] 302, precharge 303, BITLINE A 304, NET A 305, BITLINE B 306 and OUT 307. WL[0] 300 is corresponding to wordline 124, WL[X] 301 is corresponding to wordline 127, WL[1] 302 is corresponding to wordline 125, precharge 303 is corresponding to precharge transistors 104 and 113.

In the example of FIG. 4, when WL[0] 300 is activated, BITLINE A 304 will start to discharge to ground. Since BITLINE A is ⅓ of the total bitline, the time taken by BITLINE A to discharge to ground, 308 will be reduced proportionally. When BITLINE A goes to 0, the NET A goes to 1. When NET A goes to 1, the NFET 109 turns on, and BITLINE B starts to discharge to 0. The time taken for BITLINE B to discharge the remaining ⅔ of the bitline to ground is labelled as 310. Since NFET 109 has a 3X higher drive strength, the discharge time 310 is less than that of 312. 312 is the time taken by NFET 110 to discharge BITLINE B to ground. NFETs 101, 102, 103, 110, 111 and 112 may usually have a small gate width to minimize the power and reduce layout area. Hence, the time taken by 312 may be significantly longer than that of 310. Furthermore, the RC time constant of BITLINE B is also reduced, in view of the fact that BITLINE B is only ⅔ the original bitline length, which may thus speed up signal propagation to inverter 117.

In the context of this discussion, the access time is referring to the time measured from the activation of the wordline to the time output appears at the output driver 117. In accordance with features of various embodiments of this invention, the bitline may be partitioned or segmented into bitline segments corresponding to ⅓ and ⅔ of total bitline length (in terms of bit cells of the ROM array, e.g., transistors 101, 102, etc., of FIGS. 2 and 3). Partitioning the bitline to ⅓ and ⅔ may balance out the access times 314 and 315. Access time 314 is a summation of 308, 309, 310 and 311. Access time 315 is a summation of 312 and 313. Even though from WL[0] to OUT of the first bitline partition passes through more delay stages, the total delay is similar to that of WL[X] to OUT of the second bitline partition. This is due to faster BITLINE B discharge in the former case.

If, for example, the bitline is partitioned into ½ and ½ instead, the access time from WL[0] to OUT of the first bitline partition may generally be significantly slower than that of WL[X] to OUT of the second bitline partition. This may thus result in a slower overall ROM access time. If the bitline is partitioned into ¼ and ¾ instead, the access time from WL[X] to OUT of the second bitline partition may generally be much slower than that of WL[0] to OUT of the first bitline partition, which may also result in a slower overall ROM access time.

Figure 5:
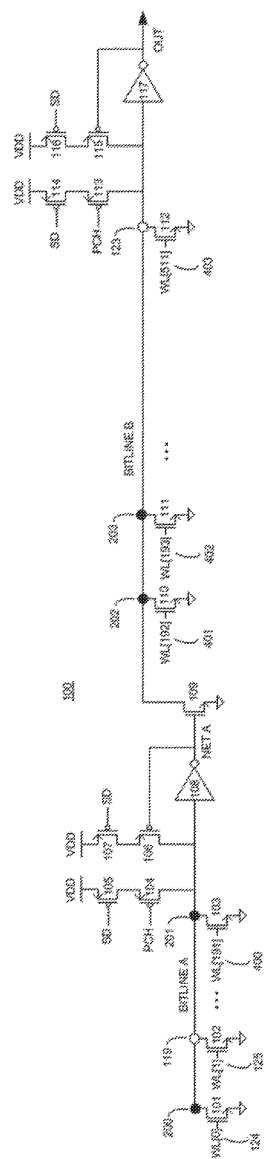
FIG. 5 is an illustration of a bitline segmented into ⅓ and ⅔ in accordance with various example embodiments of the present invention.
Figure 6:
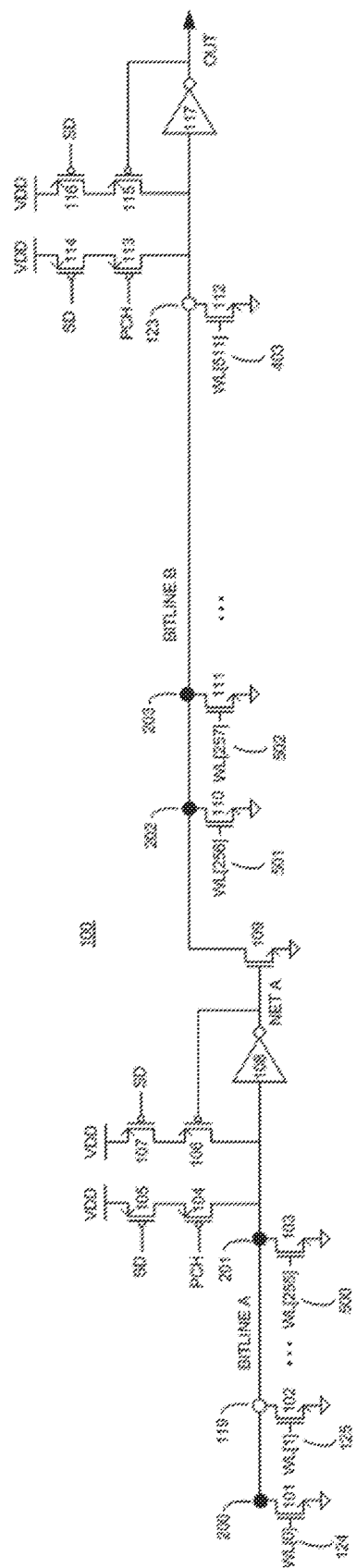
FIG. 6 is an illustration of a bitline segmented into ½ and ½.

FIG. 5 is an illustration of a bitline segmented into ⅓ and ⅔ in accordance with various embodiments of the present invention. In contrast, FIG. 6 is an illustration of bitline segmented into ½ and ½. In both illustrations, FIGS. 5 and 6, there are 512 pull down NFET per bitline shown.

FIG. 7 presents simulation data of the delay for each stage when WL[0], WL[192] and WL[256] are activated. The wordlines are mutually exclusive of each other, and hence each of them is activated at a different cycle. The unit of measurement of the delay shown in FIG. 7 is in picoseconds (ps). The data of the ⅓ segmentation is in accordance with the example circuit illustrated in FIG. 5 while the data of the ½ segmentation is in accordance with the example circuit illustrated in FIG. 6. From the simulation results shown in FIG. 7, the circuit in FIG. 5 gives a worst-case access time of 688.9 ps, while the circuit in FIG. 6 gives a worst-case access time of 782 ps. This demonstrates that ⅓ bitline partition of FIG. 5 is faster than the ½ bitline partition of FIG. 6.

In the above discussion, the proportions of the two bitline segments are discussed, e.g., as being ⅓ and ⅔. However, in many practical devices, the number of bit cells is not divisible by 3. Hence, an exact segmentation of ⅓ and ⅔ may not be possible. In such cases, the number of bit cells may be divided by three, and the smaller ("⅓") segment may have the resulting number of bit cell connections, rounded up to the nearest whole number (and similarly, the longer ("⅔") segment may correspond to ⅔, rounded down). For example, for a bitline serving 512 bits, 512 divided by 3 is approximately 170.67. In this case the "⅓" segment may be set at a length of 171, and the "⅔" segment may be set at a length of 341.

Additionally, significant performance improvements over other bit segmentations are obtained for not only the ⅓-⅔ segmentation (as described above), but also for a range around the ⅓-⅔ segmentation. In particular, segmentations corresponding to ⅓±5% (and the corresponding range about ⅔) may provide significant performance improvements over other segmentations (e.g., ½ and ½ or ¼ and ¾ segmentations) and may be almost as good as the ⅓-⅔ segmentation (again, with rounding as may be needed).

The above techniques may also be used as part of a method of fabricating a memory device. The method may include providing a bitline and a plurality of connections to bit memory cells, wherein the bitline is segmented as described above.

Various embodiments of the invention have now been discussed in detail; however, the invention should not be understood as being limited to these embodiments. It should also be appreciated that various modifications, adaptations, and alternative embodiments thereof may be made within the scope and spirit of the present invention. For example, one skilled in the art would understand that different signal and/or logic polarities, different transistor types and/or numbers, and/or other corresponding components may be substituted in the above examples and may provide corresponding results. Thus, again, the invention is not intended to be limited to any such particular example embodiment.

What is claimed is:

1. A bitline including:
a plurality of connections to a respective plurality of bit memory cells;
wherein the bitline comprises first and second bitline segments containing, respectively, approximately ⅓ of the plurality of connections and approximately ⅔ of the plurality of connections; and
wherein the first and second bitline segments are electrically coupled to provide a single bitline output,
the bitline further including:
first and second shutdown transistors connected, respectively, to the first and second bitline segments; and
first and second bitline keepers arranged in series with the respective first and second shutdown transistors,
wherein the first and second bitline keepers comprise first and second bitline keeper transistors, and wherein the gate lengths of the first and second shutdown transistors are longer than a gate length of a transistor of a bit memory cell.

2. A bitline including:
a plurality of connections to a respective plurality of bit memory cells wherein the bitline comprises first and second bitline segments containing, respectively, approximately ⅓ of the plurality of connections and approximately ⅔ of the plurality of connections; and
wherein the first and second bitline segments are electrically coupled to provide a single bitline output,
the bitline further including a transistor connected to an end of the second bitline segment and configured to be driven by an output of the first bitline segment.

3. The bitline according to claim 2, further including first and second precharge transistors, wherein the first precharge transistor is connected to the first bitline segment at a point between a one of the approximately ⅓ of the plurality of connections located closest to the second bitline segment and the second bitline segment, and wherein the second precharge transistor is connected to the second bitline segment at a point beyond a one of the approximately ⅔ of the plurality of connections located farthest from the first bitline segment.

4. The bitline according to claim 2, further including first and second shutdown transistors connected, respectively, to the first and second bitline segments.

5. The bitline according to claim 4, further including first and second bitline keepers arranged in series with the respective first and second shutdown transistors.

6. The bitline according to claim 2, further including first and second inverters disposed at respective ends of the respective first and second bitline segments, each of the first and second bitline segments having two ends, wherein the respective end of the first bitline segment is the end of the first bitline segment located closer to the second bitline segment, and wherein the respective end of the second bitline segment is the end of the second bitline segment located farther from the first bitline segment.

7. The bitline according to claim 2, further including an inverter configured to provide the output of the first bitline segment.

8. The bitline according to claim 2, wherein the transistor is a field effect transistor (FET) connected between the second bitline segment and ground, and whose gate is connected to the output of the first bitline segment.

9. The bitline according to claim 8, wherein the FET is an n-type FET (NET).

10. The bitline according to claim 8, wherein the FET has a size that is larger than a size of a transistor of the bit memory cells.

11. The bitline according to claim 10, wherein the FET has a size that is at least three times the size of a transistor of the bit memory cells.

12. The bitline according to claim 2, wherein at least one of the plurality of connections is via-programmable.

13. The bitline according to claim 2, wherein the approximately ⅓ of the plurality of connections corresponds to approximately ⅓±5% of the plurality of connections.

14. The bitline according to claim 2, wherein the approximately ⅓ of the plurality of connections is obtained by dividing a number of the plurality of connections by three and rounding up to the nearest whole number.

15. A memory device including:
a plurality of bit memory cells; and
the bitline according to claim 2, wherein the plurality of connections are to the plurality of bit memory cells.

16. The memory device according to claim 15, wherein the memory device comprises a read only memory (ROM).

17. The memory device according to claim 15, wherein one or more of the plurality of connections are via-programmable by a custom via layer during fabrication of the memory device.

18. A method of fabricating a memory device, the method including:
   providing a plurality of bit t memory cells; and
   providing the bitline according to claim 2, wherein the plurality of bit memory cells correspond to the plurality of bit memory cells of claim 2.

* * * * *